US009568518B2

(12) United States Patent
Bratfisch et al.

(10) Patent No.: US 9,568,518 B2
(45) Date of Patent: Feb. 14, 2017

(54) POWER MEASURING DEVICE WITH INTERNAL CALIBRATION OF DIODE DETECTORS

(71) Applicant: Rohde & Schwarz GmbH & Co. KG, Munich (DE)

(72) Inventors: Toralf Bratfisch, Putzbrunn (DE); Michael Katzer, Munich (DE); Thomas Reichel, Lichtenau (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 35 days.

(21) Appl. No.: 14/759,148

(22) PCT Filed: Jan. 28, 2014

(86) PCT No.: PCT/EP2014/051616
§ 371 (c)(1),
(2) Date: Jul. 2, 2015

(87) PCT Pub. No.: WO2014/127960
PCT Pub. Date: Aug. 28, 2014

(65) Prior Publication Data
US 2015/0346311 A1     Dec. 3, 2015

(30) Foreign Application Priority Data

Feb. 22, 2013 (DE) .................. 10 2013 202 903

(51) Int. Cl.
*G01R 1/02*       (2006.01)
*G01R 21/10*      (2006.01)
(Continued)

(52) U.S. Cl.
CPC .............. *G01R 21/10* (2013.01); *G01R 19/02* (2013.01); *G01R 19/32* (2013.01); *G01R 21/00* (2013.01); *G01R 35/005* (2013.01)

(58) Field of Classification Search
CPC ....... G01R 35/005; G01R 1/28; G01R 15/202; G01R 10/02; G01R 10/32; G01R 21/10; G01R 21/01; G01R 21/06; G01R 23/04; G01R 19/02; G01R 19/04; G01R 19/10
See application file for complete search history.

(56) References Cited

U.S. PATENT DOCUMENTS 3,710,253 A    1/1973   O'Neill
3,909,711 A *   9/1975   Bauer .................. B65G 47/503
                                                       324/252
(Continued)

FOREIGN PATENT DOCUMENTS

DE        69019422 T2    3/1996
DE        69214063 T2    2/1997
(Continued)

OTHER PUBLICATIONS

International Preliminary Report on Patentability for International Application No. PCT/EP2014/051616, mailed Sep. 3, 2015, 1 Page.
(Continued)

*Primary Examiner* — Son Le
*Assistant Examiner* — Thang Le
(74) *Attorney, Agent, or Firm* — Ditthavong & Steiner, P.C.

(57) ABSTRACT

A measuring device for measuring a power of a measurement signal comprises an analog-processing unit (1) and a calibration unit (5) for the implementation of a calibration procedure. The analog-processing unit (1) provides two detector diodes (14, 15) connected in an antiparallel manner relative to a signal input (10) and an amplifier (50) for the amplification of signals which are derived from output signals of the detector diodes (14, 15). The analog-processing unit (1) further provides a chopper unit (28) which is connected at two terminals in series between the detector diodes (14, 15) and the amplifier (50). In this context, the
(Continued)

calibration unit (5) comprises at least one current source, wherein the current sources (46, 47) is connected to at least one input terminal of the amplifier (50).

16 Claims, 4 Drawing Sheets

(51) Int. Cl.
*G01R 21/00* (2006.01)
*G01R 19/32* (2006.01)
*G01R 35/00* (2006.01)
*G01R 19/02* (2006.01)

(56) References Cited

U.S. PATENT DOCUMENTS

| | | | |
|---|---|---|---|
| 4,873,484 A | 10/1989 | Adam | |
| 5,204,613 A | 4/1993 | Cripps et al. | |
| 5,656,929 A * | 8/1997 | Humpherys | G01R 21/01 |
| | | | 324/76.11 |
| 6,397,160 B1 | 5/2002 | Craig et al. | |
| 6,407,540 B1 | 6/2002 | Shepherd | |
| 9,442,023 B2 * | 9/2016 | Rollin | G01K 7/01 |
| 2005/0046409 A1 * | 3/2005 | Ives | G01R 21/10 |
| | | | 324/95 |
| 2005/0116701 A1 * | 6/2005 | Hechtfischer | G01R 21/12 |
| | | | 324/95 |
| 2012/0235733 A1 | 9/2012 | Nakamoto | |

FOREIGN PATENT DOCUMENTS

| | | |
|---|---|---|
| DE | 19955342 A1 | 5/2001 |
| DE | 102006024699 A1 | 11/2007 |
| DE | 102006046966 A1 | 11/2007 |
| EP | 1043595 A1 | 10/2000 |
| EP | 1443335 A1 | 8/2004 |
| WO | 2014127960 A1 | 8/2014 |

OTHER PUBLICATIONS

Written Opinion of the International Searching Authority for International Application No. PCT/EP2014/051616, mailed Sep. 3, 2015, 6 Page.
Notification of Transmittal of Translation of the International Preliminary Report on Patentability (Chapter I or Chapter II) for International Application No. PCT/EP2014/051616, mailed Sep. 3, 2015, 1 Page.

* cited by examiner

POWER MEASURING DEVICE WITH INTERNAL CALIBRATION OF DIODE DETECTORS

CROSS-REFERENCE TO RELATED APPLICATION

The present application a national phase application of PCT Application No. PCT/EP2014/051616, filed Jan. 28, 2014, and claims priority to German Application No. DE 10 2013 202 903.9, filed on Feb. 22, 2013, the entire contents of which are herein incorporated by reference.

BACKGROUND OF THE INVENTION

Field of the Invention

The invention, according to the various embodiments described herein, relates to a power measuring device which uses diode detectors.

Discussion of the Background

Sensor heads for high-frequency (HF) power measurement operate either thermally or use diode detectors, for example, on the basis of Zero-Bias Schottky diodes or diodes using 'Planar Doped Barrier Technology'. Diodes for high-frequency power rectification are optimised for a favourable HF behaviour, for example, a low barrier-junction capacitance. However, this is achieved at the cost of robustness. These highly sensitive components can be irreversibly damaged even by very brief overshooting of the maximal power or by electrostatic discharges. This is not always evident. A total breakdown need not always be present. In many cases, a plausible measurement result can still be displayed, even if the permitted measurement deviations have already been exceeded.

For this reason, it is conventional to test or to calibrate HF power-sensor heads regularly with reference to an external calibration source. However, this method is disadvantageous, because the sensor head must be connected manually to the calibration source. In particular, in the case of a test setup in the factory, the sensor head would have to be removed from this setup. This is not desirable for a smooth manufacturing procedure. Added to this, with the use of USB power-sensor heads, such external calibration sources are not reliably available. For implementation of the measurement with such a sensor head, only a conventional PC is required.

Accordingly, a power-measuring device with internal calibration is available. In this context, a current-voltage characteristic of the detector diodes is measured. For this purpose, a known reference voltage of variable level is applied to the detector diode by means of a measurement amplifier, and the resulting current is measured. However, this testing of the functionality of the detector diode functions only if the measurement amplifier is operated in an inverted configuration, that is, if it provides a low-ohmic input. This is frequently the case with broadband sensor heads, where the open-output voltage is not measured, but instead, the short-output current of the diode detector in order to realise the short decay times in the range of a few nanoseconds required by the application. Broadband sensor heads are preferably used in a manner comparable with an oscilloscope to measure the envelope curve, that is, the time-variable amplitude of pulsed and/or modulated high-frequency measurement signals. However, in the case of sensor heads for the measurement of mean power which drive the detector in the quadratic range of the rectifier diodes, the measurement amplifier has a non-inverting configuration. This is necessary in order to measure the transformed measurement signal, the open-output voltage of the diode detector, as far as possible without falsification. The calibration cannot therefore be used with sensor heads of this kind. Furthermore, with the calibration shown in this context, the rectification effect of the detector in the quadratic range cannot be judged with a sufficiently high level of accuracy.

SUMMARY OF THE INVENTION

A power-measuring device for measuring the mean power which allows a high-precision calibration without further external devices is herein provided.

The measuring device, according to one embodiment, for measurement of a power of a measurement signal comprises an analog-processing unit and a calibration unit for the implementation of a calibration procedure. The analog-processing unit may provide two detector diodes connected in an antiparallel manner to a signal input and an amplifier for the amplification of signals which may be derived from output signals of the detector diodes. Furthermore, the analog-processing unit may provide a chopper unit which may be connected at two terminals in series between the detector diodes and the amplifier. In this context, the calibration unit may contain at least one current source, wherein the at least one current source may be connected to at least one input connection of the amplifier. Accordingly, it is possible to implement an accurate calibration.

The current source may be embodied to drive a calibration current through the chopper unit and the detector diodes. The amplifier may then be embodied to amplify a resulting calibration voltage. The measuring device may then be embodied to measure the amplified calibration voltage.

The chopper unit may be embodied to reverse the polarity of the flow direction of the calibration current through the detector diodes and to eliminate interfering influences of the amplifier. The amplifier may then be embodied to amplify resulting calibration voltages. In this case, the measuring device may be embodied to measure the amplified calibration voltages without falsification of the latter through direct-current offsets.

If no current is generated by the at least one current source, a transformed measurement signal or a zero-point voltage may be present in the amplifier. In this context, a transformed measurement signal may be understood as the output signal of the detector in response to a high-frequency measurement signal at the input of the detector. The zero-point voltage may represent the output signal of the detector if no high-frequency input signal is present apart from the thermal background noise. The amplifier may then be embodied to amplify the transformed measurement signal or the zero-point voltage. The measuring device may then be embodied to measure the transformed measurement signal or the zero-point voltage. If the measured zero-point voltage is subtracted from the measurement value of the transformed measurement signal, a corrected measured result can be obtained. However, the result of the zero-point measurement may also be used for the internal calibration with the at least one current source. The at least one current source preferably provides at least one voltage source and at least one internal resistor.

The at least one internal resistor may be larger than the output resistance of the detector, preferably at least 5 times larger, by particular preference at least 10 times larger. A constant current source is particularly preferred. The internal resistor may then be at least 1000 times larger, preferably 10,000 times larger. This may mean that the current output is as independent as possible from the output resistance of the detector, and the ohmic load of the detector output remains small. On the one hand, the ohmic load may be given by the measurement resistances, also when the current sources are switched off, and, on the other hand, the detector should ideally be operated in open circuit in order to achieve the largest possible output voltage and a low temperature coefficient of the detector.

The at least one current source preferably provides at least one switch, which may be embodied to separate the internal resistor from the voltage source and connect it to a ground terminal. In this manner, defined switching conditions can be achieved, and leakage currents of the switch can be drained to ground and do not flow into the detector output.

The measuring device may further provide a control unit which may be embodied to control the analog-processing unit and the calibration unit and to process measurement results of a calibration procedure. This allows a simple operation.

The control unit may be embodied to control a switchover of the chopper unit and a switchover of the switches of the calibration unit. In this manner, a high-precision measurement and a high-precision calibration can be achieved.

By preference, the calibration unit may be embodied to implement a calibration procedure while a measurement signal is present. In this case, the control unit may be embodied to take into consideration measurement results of the calibration procedure only if the measurement signal satisfies predetermined conditions. The measurement results of the calibration procedure may be taken into consideration only if a measurement signal provides a power such that the detector diodes are operated within the quadratic characteristic range and/or the measurement signal is constant over a predetermined stretch of time. This may mean that the measurement signal does not influence the calibration.

Alternatively, the calibration unit may be embodied to implement the calibration procedure only if no measurement signal is present. This may ensure a constantly disturbance-free calibration.

In this context, the analog-processing unit may be preferably constructed in a largely symmetrical manner. The calibration unit may also be constructed in a largely symmetrical manner. This may mean that interference values are largely compensated.

The calibration unit may provide two current sources. The two current sources then each may comprise a voltage source and an internal resistor. The two current sources may then be polarised in opposition and to the two terminals of the amplifier. This may allow a symmetrical construction.

Furthermore, the measuring device may contain a temperature-measurement unit which may be embodied to measure the temperature during the implementation of the calibration procedure. The measuring device may then be embodied to use the measured, present temperature for a temperature compensation of the calibration procedure. This achieves a particularly accurate calibration.

BRIEF DESCRIPTION OF THE DRAWINGS

In the following, the invention is described by way of example with reference to the drawings which illustrate an advantageous exemplary embodiment of the invention. The drawings show.

The general construction and general functioning of an exemplary embodiment of the measuring device according to the invention will first be explained with reference to FIG. 1. The construction of components substantial to the invention in the exemplary embodiment of the measuring device according to the invention and its function will then be explained in detail with reference to FIG. 2a-FIG. 2c. In some cases, the presentation and description of identical elements in similar drawings has not been repeated.

Figure 1:
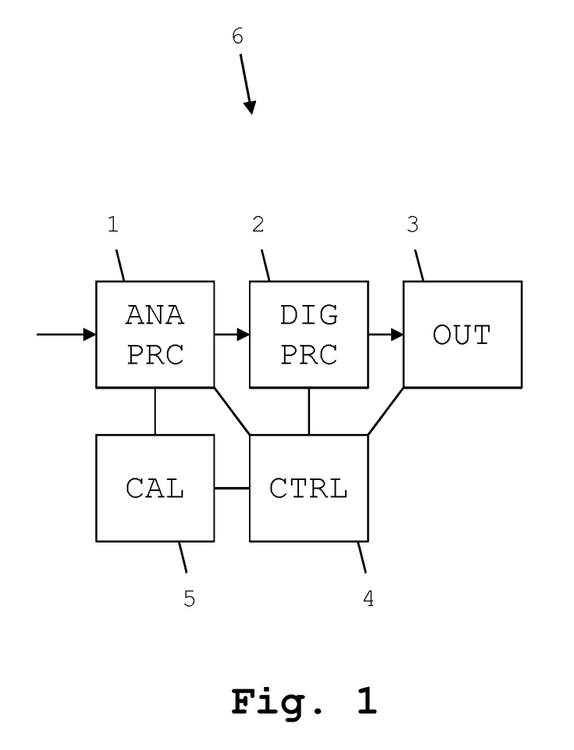
FIG. 1 a block-circuit diagram of the measuring device according to one embodiment in an overview.

FIG. 1 shows an exemplary embodiment of the measuring device 6 according to the invention. The measuring device 6 comprises an analog-processing unit 1, connected to the latter, a digital-processing unit 2 and connected to this, a measurement-value output unit 3. Furthermore, it comprises a calibration unit 5 which is also connected to the analog-processing unit 1. Furthermore, the measuring device comprises a control unit 4, which is connected to the analog-processing unit 1, the digital-processing unit 2, the measurement-value output unit 3 and the calibration unit 5.

In the measurement mode, a measurement signal is supplied to the analog-processing unit 1. The analog-processing unit 1 converts the measurement signal into an analog signal, a transformed measurement signal, which allows inferences regarding the power of the measurement signal. This analog signal is converted into a digital signal and supplied to the digital-processing unit 2. Starting from the digitised signal, the digital-processing unit 2 determines a power of the measurement signal. This is provided to the measurement-value output unit 3. In this context, the control unit 4 controls the function of the analog-processing unit 1, the digital processing unit 2 and the measurement-value output unit 3. The detailed construction of the named units will be explained in greater detail with reference to FIGS. 2a-2c.

In order to implement a calibration, the control unit 4 controls the calibration unit 5, the analog-processing unit 1, the digital-processing unit 2 and the measurement-value output unit 3. In particular, it causes the calibration unit 5 to drive a calibration current through the analog-processing unit 1. In particular, the control unit 4 then controls the analog-processing unit 1 to measure a resulting calibration voltage. The exact process will be described in greater detail with reference to FIGS. 2a-2c.

Figure 2A:
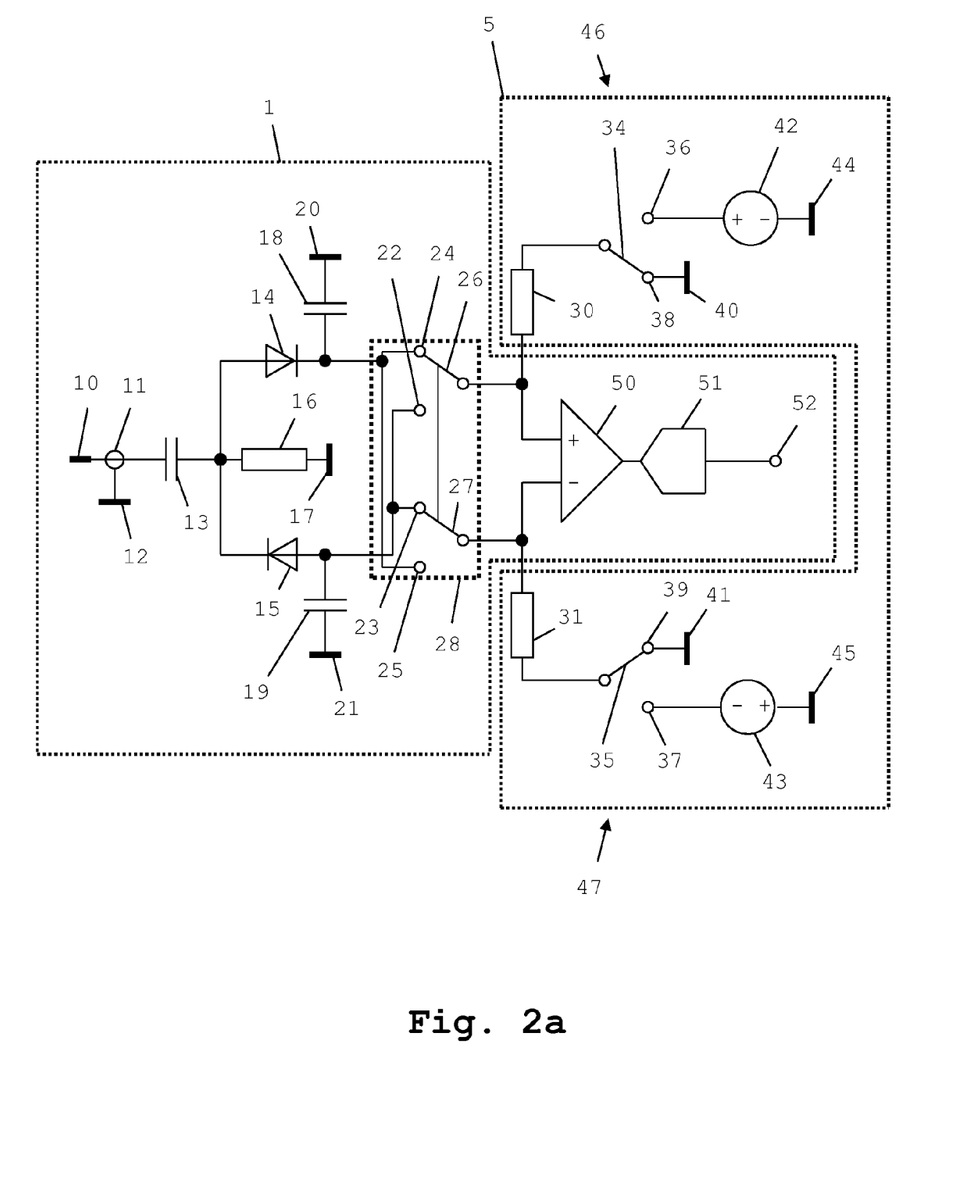
FIG. 2a a first detail view of the measuring device according to one embodiment.

FIG. 2a illustrates a first exemplary embodiment of the measuring device 6 according to the invention in a detail view. Only the analog-processing unit 1 and the calibration unit 5 are illustrated here.

The analog-processing unit 1 contains a signal input 10 which is embodied for the feeding in of a measurement signal. Furthermore, it contains a ground input 11 to which a shielding of the connecting cable which carries the measurement signal can be connected. The ground input 11 is connected to an internal ground terminal 12. The signal input 10 is connected to a coupling capacitor 13. In turn, the capacitor 13 is connected at its terminal facing away to a first detector diode 14, a resistor 16 and a second detector diode 15. The detector diodes 14 and 15 are configured in this context in an antiparallel manner. That is, from the perspective of the capacitor 13, the first detector diode 14 is connected in the flow direction, while the second detector diode 15 is connected opposite to the flow direction. In other words, the anode of the first diode 14 is connected to the capacitor 13 and/or the resistor 16, while the cathode of the second diode 15 is connected to the capacitor 13 and/or the resistor 16.

The resistor 16, which acts as an absorber for the measurement signal arriving at the signal input 10, is connected at its end facing away to a ground terminal 17. The terminal of the first detector diode 14 facing away from the capacitor 13, here the cathode, is connected to a capacitor 18 connected to a ground terminal 20. The terminal of the detector diode 15 facing away from the capacitor 13, here the anode, is also connected to a ground terminal 21 by means of a capacitor 19.

Furthermore, the terminal of the first detector diode 14 facing away from the capacitor 13 is connected to a first terminal of a chopper unit 28. The terminal of the second detector diode 15 facing away from the capacitor 13 is connected to a second terminal of the chopper unit 28.

In this context, the chopper unit 28 contains a first switch 26 and a second switch 27. Accordingly, the first switch 26 serves for the switchover between a first terminal 22 and a second terminal 24. In this context, the second switch 27 serves for a switchover between a first terminal 23 and a second terminal 25. The terminals 24 and 25 are connected, in this context, to one another and to the terminal of the first detector diode 14 facing away from the capacitor 13. The terminals 22 and 23 are connected, in this context, to one another and to the terminal of the second detector diode 15 facing away from the capacitor 13.

The switches 26 and 27 of the chopper unit 28 are accordingly embodied in such a manner that they always switch simultaneously. That is, the terminals 23 and 24 or respectively 22 and 25 are always connected at the same time. Accordingly, the chopper unit 28 fulfils the function of reversing the polarity of the signals of the detector diodes 14, 15. That is, in a first switch position (for example, terminals 23, 24 active), the output signal of the detector diodes 14, 15 is transmitted to the downstream amplifier 50 with reversed polarity by comparison with a second switch position (for example, terminals 22, 25 active).

The first switch 26 of the chopper unit 28 is accordingly connected to a positive input terminal of an amplifier 50. The second switch 27 of the chopper unit 28 is then connected to a negative input of the amplifier 50. In this context, the amplifier 50 is configured in such a manner that it amplifies the voltage between its two inputs and, at the same time, the impedances between its two inputs, on the one hand, and between each of the two inputs and the circuit grounds 12, 20, 21, 40, 41, 44, 45, on the other hand, are so large that the output voltages of the detector are only influenced to a negligibly slight extent or not at all by this ohmic load. In general, this is achieved by an amplifier 50 in non-inverting configuration. An output terminal of the amplifier 50 is connected to an analog-digital converter 51 which is connected in turn to a signal output 52 of the analog-processing unit 1.

In order to perform a measurement, a measurement signal is supplied to the input terminal 10. DC-components of the measurement signal are removed by means of the capacitor 13. The detector diodes 14, 15 convert the measurement signal into a signal which allows inferences to be made regarding the power of the measurement signal. The detector diodes 14, 15 are thus preferably operated within the quadratic characteristic range. Via the capacitors 18, 19 and the corresponding ground terminals 20, 21, a decoupling of the output signal of the detector from the high-frequency measurement signal is achieved in that these capacitors connect the terminals of the detector diodes 14 and 15 facing away from the capacitor 13 in a high-frequency manner to ground, while, at the same time, they ensure that, in consequence of the rectification of the measurement signal, two output voltages equivalent to the latter can be formed.

The chopper unit 28 reverses the polarity of the output signals of the detector diodes 14, 15 regularly in order to compensate any differences present between the detector diodes 14, 15 in the output signal and to minimise the influence of interference values. Interference factors are primarily leakage currents and offset voltages of the amplifier 50. The output signals of the chopper unit 28 are amplified by the amplifier 50 and converted by the analog-digital converter into a digital output signal which is supplied in a subsequent stage to the digital processing unit 2 from FIG. 1 for further digital processing. The further course of the measurement will not be explained here because it is not relevant for the present invention.

Furthermore, in each case, current sources 46, 47 are connected to the input terminals of the amplifier 50. A first current source 46 is connected to the positive input terminal of the amplifier 50. A second current source 47 is connected to the negative input terminal of the amplifier 50. The current sources 46, 47 each comprise an internal resistor 30, 31, which is connected in each case to the respective input terminal of the amplifier 50. Alternatively, the two current sources 46, 47 can be replaced by a common current source. In this case, one terminal of the common current source is connected in each case to an input terminal of the amplifier 50.

The internal resistors 30, 31 preferably provide the same value. In this context, the values of the internal resistors 30, 31 are preferably selected to be larger than the zero-point resistances of the detector diodes 14, 15. For example, a value of 10 MΩ is used in the case of a typical diode zero-point resistance of 10 kΩ.

The internal resistors 30, 31 must be selected not to be too small in this context, so that the measured calibration voltage is not unnecessarily reduced as a result of the voltage division. Furthermore, they should be selected in such a manner that a resulting amperage is so large that an average voltage drop $V_0$ is preferably so large that the detector is driven, on the one hand, as far as possible, but the quadratic range of the characteristic is still, as far as possible, not left. However, a fixed limit for the quadratic characteristic range does not exist in this context. Conventionally, it is regarded as $V_0$=mnuT.

Switches 34, 35, which each switch between two terminals 36, 37 or respectively 38, 39 are connected in each case to the terminals of the internal resistors 30, 31 facing respectively away. With both current sources 46, 47, one first terminal 36, 37 is connected respectively to a voltage source 42, 43, which is connected in turn to a ground terminal 44, 45. In each case, a second terminal 38, 39 is connected to a ground terminal 40, 41.

If a calibration is now to be implemented, a zero-point voltage is initially amplified by the amplifier 50 and converted by the analog-digital converter 51 into a digital zero-point voltage. In this context, the zero-point voltage is measured as an output signal of the detector diodes 14, 15 in succession at the two different switch positions of the chopper unit 28, without the presence of a calibration current. Precisely if no measurement is implemented, the zero-point voltage is not influenced by any measurement signal. Alternatively, precisely if a measurement is implemented, then the zero-point voltage is influenced by the measurement signal. However, the measured zero-point voltage can be used for the calibration if the measurement signal is constant during the entire calibration and sufficiently small so that the detector diodes 14, 15 are operated within the quadratic range.

If the measurement signal satisfies these conditions, the measurement signal is measured merely as an additional displacement of the zero-point of the calibration measurement and accordingly as an additive zero-point voltage.

The measurement of the zero-point voltage is shown in FIG. 2a. In this context, only a first switch position of the chopper unit 28 is shown. Of course, the zero-point voltage is measured for both switch positions of the chopper unit 28. That is, the voltage sources 42, 43 are separated by means of the switches 34, 35 from the internal resistors 30, 31 and therefore from the input terminals of the amplifier 50 and from the chopper unit 28.

The zero measurement has the purpose of removing the influence of any measurement signal present from the calibration values V0 and ΔV, and the influence of the offset voltage of the amplifier 50 from the calibration value V0 (equation 8). Since both interference values—the zero-point output voltage of the detector and the offset voltage of the amplifier—are added to one another in the one chopper setting but subtracted from one another in the other, it is not possible to eliminate both values from the calibration result with a single zero measurement.

If, instead of this, a zero measurement is implemented for each of the two chopper settings, and these zero-measurement results are subtracted from the measurement results for the calibration voltage in each case with the identical chopper settings, both influencing values are eliminated from the calibration values V0 and ΔV.

The influence of the amplifier offset voltage is also eliminated in the calibration value ΔV without a second zero measurement, and, in fact, merely by forming the difference between the two calibration voltages.

Figure 2B:
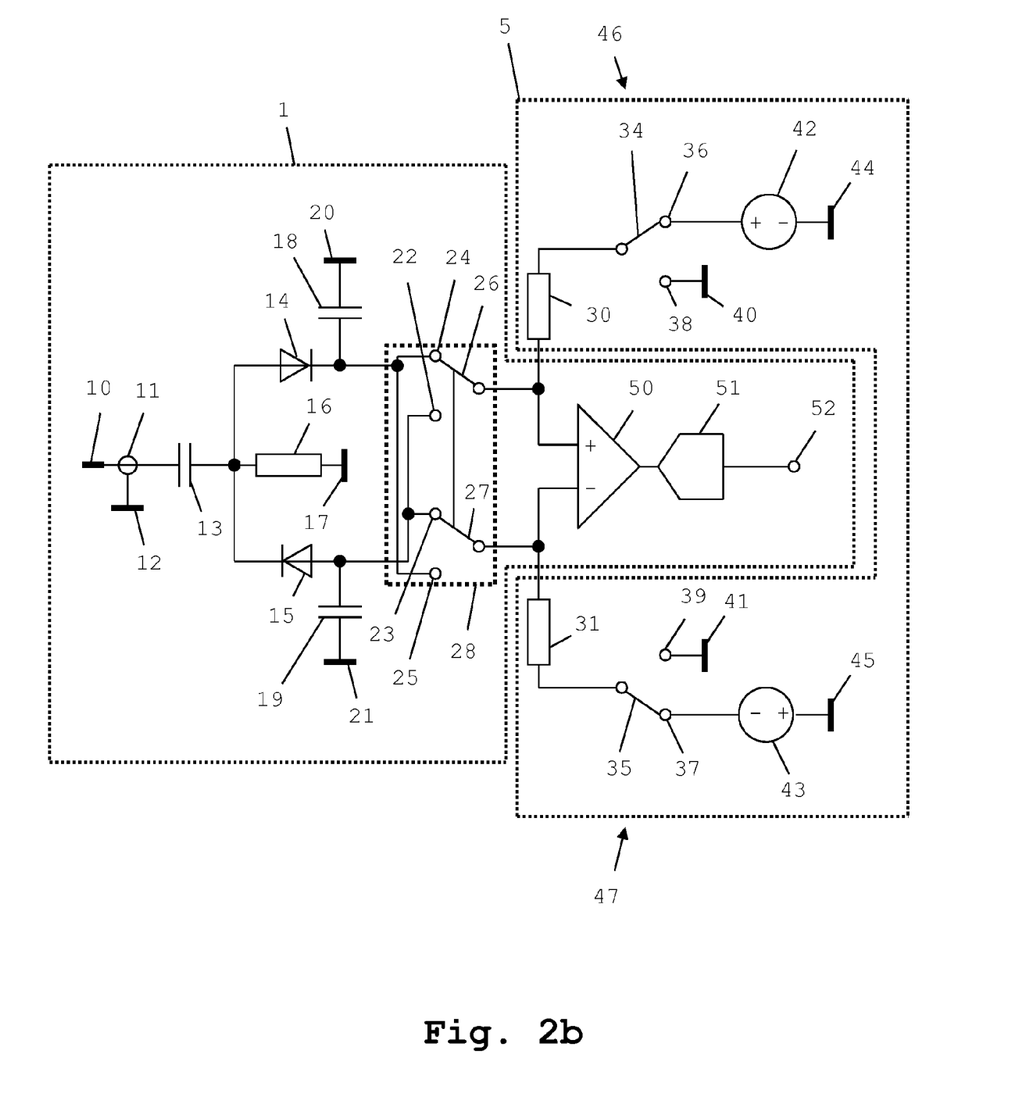
FIG. 2b a second detail view of the measuring device according to one embodiment.

After the zero-point voltage has been measured, the switch position of the switches 34, 35 is changed. This is shown in FIG. 2b. The terminals 36, 37 are now connected via the internal resistors 30, 31 to the input terminals of the amplifier 50. The voltage sources 42, 43 now each generate a constant voltage opposite in direction but identical in value and transmit it via the switches 34, 35 to the internal resistors 30, 31, which convert it in each case into a constant current and transmit this via the chopper unit 28, that is, via the switches 26, 27 to the terminals 24, 23. The positive terminal of the voltage source 42 is accordingly connected to the terminal 24 of the chopper unit, while the negative terminal of the voltage source 43 is connected to the terminal 23 of the chopper unit 28. In this manner, a current flow is obtained from the voltage source 42, via the terminal 24 of the chopper unit 28, via the detector diode 14, via the detector diode 15, via the terminal 23 of the chopper unit 28, to the negative terminal of the voltage source 43.

In this context, a constant current is obtained, since the resistors 30, 31 are large by comparison with the internal resistances of the detector diodes 14, 15 and large by comparison with the bulk resistances on a current path. By preference, the internal resistances are at least five times, by particular preference at least ten times as large as all of the other resistances in the current path.

Figure 2C:
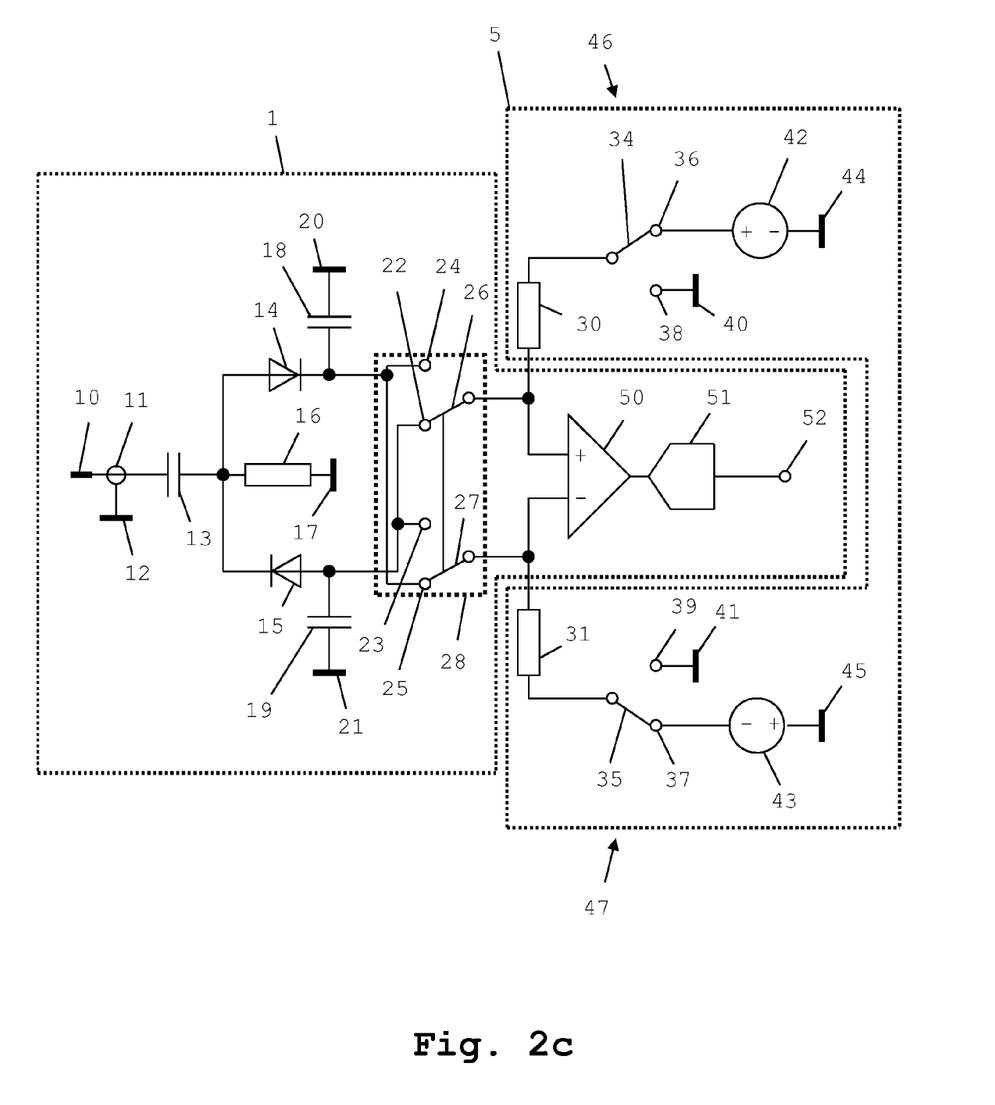
FIG. 2c a third detail view of the measuring device according to one embodiment.

A resulting voltage at the terminals of the amplifier 50 is amplified by the amplifier 50 and digitised by the analog-digital converter 51. As soon as this measured value has been registered, the switch position of the chopper unit 28 is changed. This is shown in FIG. 2c. The switches 26, 27 now connect the input terminals of the amplifier 50 to the terminals 22, 25 of the chopper unit. Accordingly, a current flow is obtained from the positive terminal of the voltage source 42, via the switch 34, via the internal resistor 30, via the switch 26 of the chopper unit 28, via the terminal 22 of the chopper unit, via the detector diode 15, via the detector diode 14, via the terminal 25 of the chopper unit, via the switch 27 of the chopper unit, via the internal resistor 31, via the switch 35, to the negative terminal of the voltage source 43.

Here also, the voltage between the input terminals of the amplifier 50 is amplified by the latter and digitised by the analog-digital converter 51. Accordingly, the zero-point voltage and the first calibration voltage, and the second calibration voltage are present in succession as digitised values at the output terminal 52. These four values are further processed as explained in the following. Further runs of this calibration measurement can be implemented optionally, in order to increase the measurement accuracy.

Especially in the case of a running measurement, that is, if the calibration is implemented during a connection of a measurement signal to the input terminal 10, it is meaningful to implement a calibration during a relatively long stretch of time and, in this manner, to record a plurality of zero-point voltages and calibration voltages with both polarisations. Only when the measurement signal fulfils the conditions named above, can the data obtained within the framework of the calibration measurements be used.

The voltage sources 42, 43 accordingly generate a constant voltage of identical magnitude which, however, differs, as explained, with regard to its polarisation.

The switches 34, 35 of the calibration unit 5 are thus preferably realised as semiconductor switches. It is advantageous in the embodiment as a change-over switch that, in the normal measurement mode and during the zero measurements, leakage currents of the switches are drained away to the ground terminals 40, 41 in a defined manner. Alternatively, only break contacts can, of course, be used, which establish the connection with the voltage sources 42, 43 or not.

Associated with the embodiment as a change-over switch is the circumstance that, in the measurement mode, the two internal resistors 30, 31 load the detector output voltage at the input terminals of the amplifier 50. However, this can be tolerated if the value of the internal resistors 30, 31 is dimensioned to be sufficiently high. Furthermore, the deviations can be compensated by calculation. For the realisation of the voltage sources 42, 43, it is possible to work with two-pole shunt references, for example, of the type LM4040. A practical value for the constant voltage is then, for example, $V_{REF}=2.5$ V.

In order to achieve a simple evaluation of the voltage measured within the framework of the calibration, a zero calibration is implemented. That is, the zero-point voltage is subtracted from the calibration voltages. As described above, the calibration is carried out for both switch positions of the chopper unit 28. For the following embodiments, it is assumed that the measured calibration voltages have already been zero-point corrected.

Accordingly, the first calibration measurement corresponds to a point $-I_{TEST,1}, -V_{TEST,1}$. The minus signs in this context are intended to indicate that both diodes in this measurement are polarised in the blocking direction. Accordingly, the switches 34, 35 are arranged as shown in FIG. 2b. The constant current is guided through the detector diodes 14, 15 in the blocking direction, and the declining, first calibration voltage $-V_{TEST,1}$ is measured. Following this, a further measurement point $-I_{TEST,2}, -V_{TEST,2}$ is measured. Here, the switches 34, 35 are also in the position illustrated in FIG. 2b. In this context, the chopper unit 28 is in the position illustrated in FIG. 2c. Accordingly, the constant calibration current is guided through the diodes in the conducting direction. Once again, the declining voltage is measured by means of the amplifier 50 and the analog-digital converter 51.

The following deliberations are based on a diode equation:

$$I_F = I_S \cdot \left[\exp\left(\frac{V_F}{m \cdot n \cdot V_T}\right) - 1\right] \tag{1}$$

In this context, $I_F$ denotes the current in the flow direction, $I_S$ denotes the off-state saturation current of the diodes, $V_F$ denotes the voltage present across the diodes in the flow direction, m denotes the number of diodes of the same type connected in series, n denotes the ideality factor of the diodes and $V_T$ denotes the voltage equivalent of thermal energy of an individual diode. Equation (1) applies both for currents in the flow direction and also in the blocking direction. The meaning here is: if the reference arrows for voltage and current are defined in the flow direction, this equation is valid for the diode voltage and diode current.

This equation is transformed according to the voltage present in the diodes in the flow direction:

$$V_F = m \cdot n \cdot V_T \cdot \ln\left(\frac{I_F}{I_S} + 1\right). \tag{2}$$

This expression can now be presented as a Taylor series. For a small level control, which applies for the operation of the detector within a quadratic range, the development of the series can still be interrupted after the quadratic element to obtain the quadratic approximation:

$$V_F = \frac{I_F \cdot m \cdot n \cdot V_T}{I_S} - \frac{I_F^2 \cdot m \cdot n \cdot V_T}{2 \cdot I_S^2}. \tag{3}$$

In order to compare the measurement points in this model, the following quadratic equation system is set up as a formulation:

$$-V_{TEST,1} = -I_{TEST,1} \cdot c_1 + I_{TEST,1}^2 \cdot c_2$$

$$V_{TEST,2} = I_{TEST,2} \cdot c_1 + I_{TEST,2}^2 \cdot c_2 \tag{4}$$

An exact solution exists, but this is somewhat complicated. Accordingly, the following procedure is adopted in order to provide a visually organised calculation:

$$I_{TEST,1} = I_{TEST,2} = I_{TEST}. \tag{5}$$

That is to say, the small change in the test current between the measurement in the blocking range and the measurement in the let-through range is ignored. It is assumed that the test current has been fed in via ideal current sources. Accordingly, the simplification of equation (4) is as follows:

$$-V_{TEST,1} = -I_{TEST,1} \cdot c_1 + I_{TEST}^2 \cdot c_2$$

$$V_{TEST,2} = I_{TEST,2} \cdot c_1 + I_{TEST}^2 \cdot c_2 \tag{6}$$

and the solution of the equation system is:

$$c_1 = \frac{V_{TEST,1} + V_{TEST,2}}{2 \cdot I_{TEST}} \tag{7}$$

and $$c_2 = -\frac{V_{TEST,1} - V_{TEST,2}}{2 \cdot I_{TEST}^2}.$$

With the substitution $$\frac{V_{TEST,1} + V_{TEST,2}}{2} = V_0 \tag{8}$$

and $$\frac{V_{TEST,1} - V_{TEST,2}}{2} = \Delta V,$$

the following is obtained:

$$c_1 = \frac{V_0}{I_{TEST}} \tag{9}$$

and $$c_2 = -\frac{\Delta V}{I_{TEST}^2}.$$

A coefficient comparison between equation (3) and a quadratic formulation with the determined coefficients $c_1$ and $c_2$ is now performed:

$$\underbrace{\frac{m \cdot n \cdot V_T}{I_S} \cdot I_F - \frac{m \cdot n \cdot V_T}{2 \cdot I_S^2} \cdot I_F^2}_{Model} = \underbrace{\frac{V_0}{I_{TEST}} \cdot I_F - \frac{\Delta V}{I_{TEST}^2} \cdot I_F^2}_{Measurement} \tag{10}$$

Linear Coefficient:

$$\frac{m \cdot n \cdot V_T}{I_S} = \frac{V_0}{I_{TEST}} \rightarrow I_S = \frac{m \cdot n \cdot V_T \cdot I_{TEST}}{V_0} \tag{11}$$

Quadratic Coefficient:

$$-\frac{m \cdot n \cdot V_T}{2 \cdot I_S^2} = -\frac{\Delta V}{I_{TEST}^2} \tag{12}$$

$I_S$ is eliminated by inserting equation (11) into equation (12). After simplification the following is obtained:

$$n = \frac{V_0^2}{2 \cdot m \cdot V_T \cdot \Delta V}. \tag{13}$$

It is known that, between the input and output voltage of an un-loaded, one-way diode detector with m series-connected diodes which is operated within the quadratic range, the following interconnection applies:

$$V_{OUT} = \frac{V_{IN,EFF}^2}{2 \cdot m \cdot n \cdot V_T}. \qquad (14)$$

When resolved according to n, the following is obtained:

$$n = \frac{V_{IN,EFF}^2}{2 \cdot m \cdot V_T \cdot V_{OUT}} \qquad (15)$$

If the average voltage value $V_0$ in equation (13) is regarded as the effective value $V_{IN,EFF}$ of a fictional input voltage and the voltage difference $\Delta F$ is regarded as a resulting output voltage of the detector, the two equations (13) and (15) describe the same factual situation. This proves that the DC-test presented in this patent application allows the rectification effect of the detector to be determined for alternating voltages.

As equation (15) shows, the rectification effect of a given detector at a given temperature T depends only upon the ideality factor n if the voltage equivalent of thermal energy $V_T$ is regarded as given. However, the voltage equivalent of thermal energy $V_T$ is itself also somewhat temperature dependent, the following applies:

$$V_T = \frac{k \cdot T}{e}, \qquad (15)$$

which corresponds to a temperature coefficient of the detector of approximately −0.3%/K. In this context, k is the Boltzmann constant, e is the elementary charge and T is the temperature in Kelvin. Accordingly, the temperature must also always be measured if inferences are to be made regarding the stability of the detector at different calibration temperatures.

The ideality factor n is also somewhat temperature dependent, which must be taken into consideration in the case of very stringent requirements for the precision of the calibration, however, only if different calibration temperatures are to be permitted. Accordingly, a model for the temperature dependence of the ideality factor is required in order to compare two ideality factors measured at different temperatures. But this model for the temperature dependence of n is required anyway for a normal measurement mode if the influence of the ambient temperature is to be completely eliminated from the measurement result. As a result, no extra effort is therefore generally required.

The model for the temperature dependence of n can also be used to define n for a rigidly specified reference temperature $T_{ref}$, typically 300 Kelvin, in order to implement comparisons only after the reduction of n to this reference temperature. In the case of the first internal calibration corresponding to the present invention, which may be carried out in the manufacturer's factory, the ideality factor n would therefore initially be calculated according to equation 13, wherein $V_T$ would be calculated for the similarly determined temperature T. With the mathematical model for the temperature dependence of n, the ideality factor $n_{ref}$ would be calculated from this in a second step for the reference temperature $T_{ref}$, and stored in a calibration record of the sensor head. In the case of the subsequent implementation of an internal calibration, the ideality factor n' would again initially be determined, which would also be scaled to the reference temperature in the second step. The reduced value $n'_{ref}$ obtained would then be compared with the stored value $n_{ref}$. If the deviation is disposed outside a predetermined tolerance range, damage to the detector must be assumed.

The circuit is also suitable for determining the zero-point resistance of the diodes. The zero-point resistance is the linear coefficient $c_1$ from equation (7).

Finally, the exact equation for the rectification value without the approximation from equation (5) is specified as:

$$n = \frac{1}{2 \cdot m \cdot V_T} \cdot \frac{(V_{TEST,1} + V_{TEST,2})^2 \cdot (V_{TEST,1} \cdot V_{TEST,2} + 4 \cdot V_{REF}^2)^2}{[V_{TEST,1} \cdot V_{TEST,2} + V_{REF}(V_{TEST,1} - V_{TEST,2})] \cdot} \qquad (16)$$
$$(V_{TEST,1} - 2 \cdot V_{REF}) \cdot (V_{TEST,2} + 2 \cdot V_{REF}) \cdot$$
$$(V_{TEST,1} - V_{TEST,2} - 4 \cdot V_{REF})$$

This expression is not as visually organised as the expression from equation (13), but it is generally valid and can be handled numerically without difficulty even on a low-performance computer.

The invention is not restricted to the exemplary embodiment presented. In particular, the polarities of the current sources 46 and 47 can be exchanged, that is, if the switch 26 were placed into the position 24, the current would flow through the diodes in the flow direction (in the example presented, it is precisely reversed). Advantageously, all of the features described above or the features shown in the drawings can be arbitrarily combined with one another within the scope of the invention.

The invention claimed is:

1. A measuring device for measuring a power of a measurement signal with an analog-processing unit and a calibration unit for the implementation of a calibration process,
   wherein the analog-processing unit provides two detector diodes connected in an antiparallel manner relative to a signal input and an amplifier for the amplification of signals which are derived from output signals of the detector diodes,
   wherein the analog-processing unit further provides a chopper unit which is connected at two terminals in series between the detector diodes and the amplifier, and
   wherein the calibration unit provides at least one current source, wherein the at least one current source is connected to at least one input terminal of the amplifier.

2. The measuring device according to claim 1,
   wherein the at least one current source is embodied to drive a calibration current through the chopper unit and the detector diodes,
   wherein the amplifier is embodied to amplify a resulting calibration voltage, and
   wherein the measuring device is embodied to measure the amplified calibration voltage.

3. The measuring device according to claim 2,
   wherein the chopper unit is embodied to reverse the polarity of a flow direction of the calibration current through the detector diodes,
   wherein the amplifier is embodied to amplify resulting calibration voltages, and
   wherein the measuring device is embodied to measure the amplified calibration voltages.

4. The measuring device according to claim 1,
   wherein a zero-point voltage is present in the amplifier if no current is generated by the at least one current source, wherein the amplifier is embodied to amplify the zero-point voltage, and
wherein the measuring device is embodied to measure the amplified zero-point voltage.

5. The measuring device according to claim 1,
wherein the at least one current source provides a voltage source and an internal resistor.

6. The measuring device according to claim 5,
wherein the at least one internal resistor is larger than an output resistance of the detector diodes, preferably at least 5 times larger, by particular preference at least 10 times larger.

7. The measuring device according to claim 6,
wherein the at least one current source provides a switch which is embodied to separate the at least one internal resistor from the at least one voltage source and connect it to at least one ground terminal.

8. The measuring device according to claim 1,
wherein the measuring device further provides a control unit which is embodied to control the analog-processing unit and the calibration unit and to process measurement results of a calibration procedure.

9. The measuring device according to claim 8,
wherein the control unit is embodied to control a switchover of the chopper unit and a switchover of all switches of the calibration unit.

10. The measuring device according to claim 8,
wherein the calibration unit is embodied to implement the calibration procedure while a signal is present and
wherein the control unit is embodied to take into consideration measurement results of the calibration procedure only if the measurement signal satisfies predetermined conditions.

11. The measuring device according to claim 10,
wherein the control unit is embodied to take into consideration measurement results of the calibration procedure only if a measurement signal provides a power such that the detector diodes are operated within a quadratic characteristic range, and/or
a measurement signal is constant over a predetermined stretch of time.

12. The measuring device according to claim 9,
wherein the calibration unit is embodied to implement the calibration procedure only if no measurement signal is present.

13. The measurement device according to claim 1,
wherein the amplifier is configured in such a manner that it is operated in a high-ohmic manner at its two inputs.

14. The measuring device according to claim 1,
wherein the analog-processing unit is constructed at least largely symmetrically, and/or
wherein the calibration unit is constructed at least largely symmetrically.

15. The measuring device according to claim 14,
wherein the calibration unit provides two current sources,
wherein the two current sources each comprise a voltage source and an internal resistor,
wherein the two current sources are polarized in opposite directions and
wherein the two current sources are connected to the two terminals of the amplifier.

16. The measuring device according to claim 1,
wherein the measuring device further contains a temperature measuring device which is embodied to measure a present temperature during the implementation of the calibration procedure, and
wherein the measuring device is embodied to use the measured, present temperature for a temperature compensation of the calibration procedure.

* * * * *